United States Patent [19]

Smith

[11] 4,225,010

[45] Sep. 30, 1980

[54] LOUDSPEAKER SYSTEM

[75] Inventor: Lloyd B. Smith, Birmingham, Ala.

[73] Assignee: Arthur P. Bagby, Birmingham, Ala. ; a part interest

[21] Appl. No.: 30,998

[22] Filed: Apr. 18, 1979

Related U.S. Application Data

[63] Continuation-in-part of Ser. No. 857,651, Dec. 5, 1977, abandoned.

[51] Int. Cl.[3] .............................................. H05K 5/00

[52] U.S. Cl. .................................. 181/155; 181/166; 181/199

[58] Field of Search ............... 181/144, 148, 154, 155, 181/156, 152, 199, 163, 166, 175

[56] References Cited

U.S. PATENT DOCUMENTS

| | | | |
|---|---|---|---|
| 2,171,940 | 9/1939 | Macnabb | 181/148 |
| 2,750,245 | 6/1956 | MacIntyre | 181/156 |
| 2,915,134 | 12/1959 | Braund | 181/156 |
| 3,540,544 | 11/1970 | Karlson | 181/154 |
| 3,818,138 | 6/1974 | Sperrazza, Jr. | 181/199 |
| 3,912,866 | 10/1975 | Fox | 181/155 |
| 3,964,571 | 6/1976 | Snell | 181/155 |

FOREIGN PATENT DOCUMENTS

| | | | |
|---|---|---|---|
| 342,369 | 2/1931 | United Kingdom | 181/152 |

*Primary Examiner*—L. T. Hix
*Assistant Examiner*—Benjamin R. Fuller
*Attorney, Agent, or Firm*—Woodford R. Thompson, Jr.

[57] ABSTRACT

A loudspeaker system embodies an enclosure defining a sound chamber having a front wall with a sound emitting opening therein. An outwardly and forwardly flaring speaker cone is mounted within the enclosure and adjacent the opening therein with the innermost portion of the speaker cone emitting more distorted sound than the outermost portion thereof. At least one reflector is mounted outwardly of the enclosure and forwardly of an outer portion of the speaker cone with the innermost edge of the reflector being located at least 15 per cent of the radial distance measured outwardly from the outer edge of the loudspeaker voice coil to the outer edge of the cone diaphragm with the sound being reflected by the reflector being directed outwardly of the enclosure at least 90° from a line extending forwardly along the axis of the loudspeaker cone.

8 Claims, 11 Drawing Figures

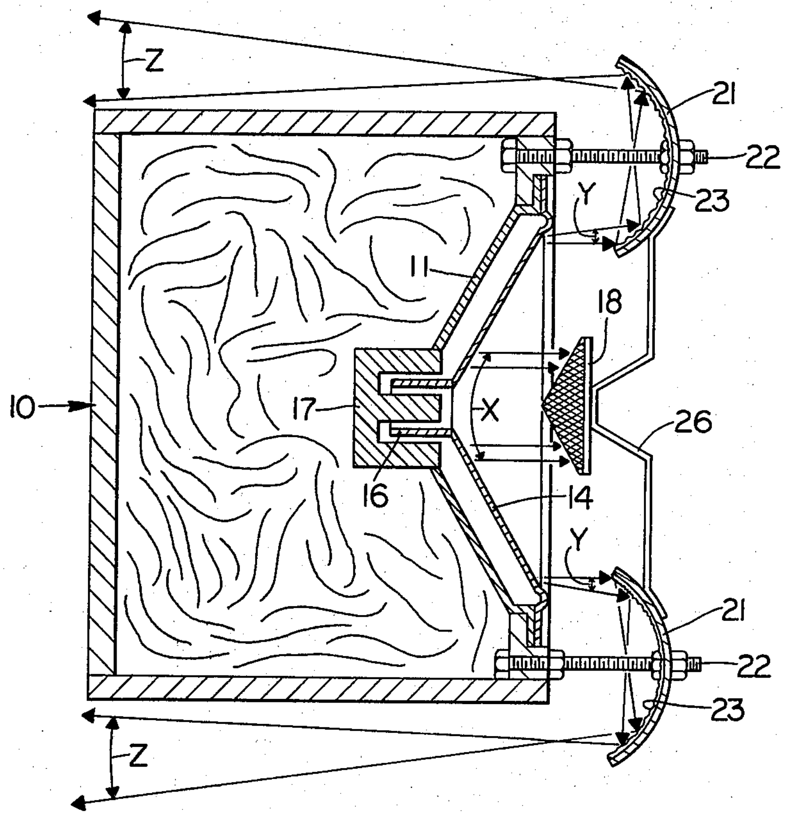
FIG. 6
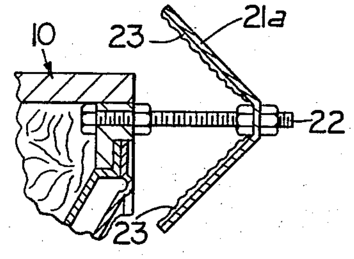
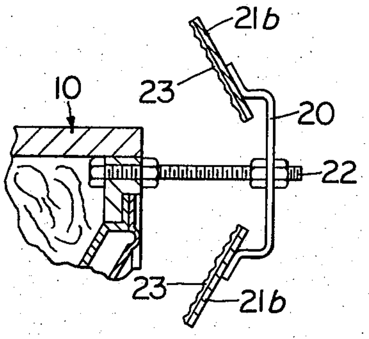
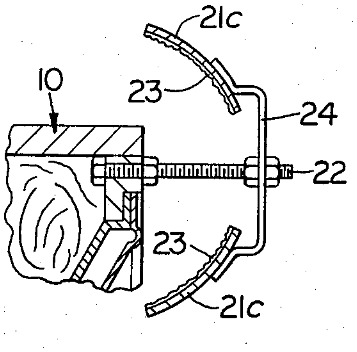
FIG. 2 FIG. 3 FIG. 4

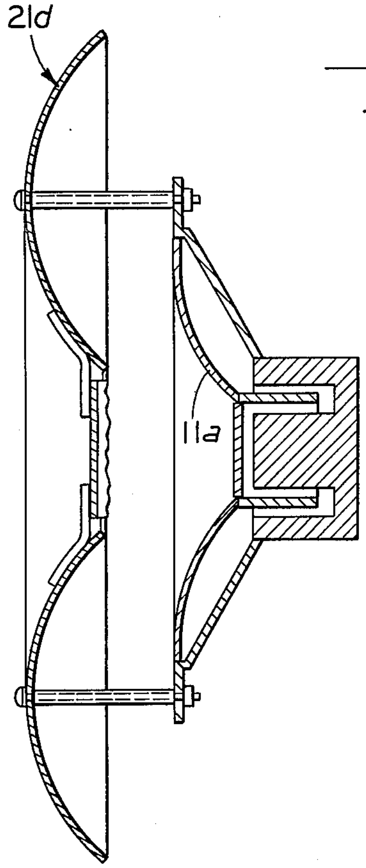
FIG. 9
FIG. 10
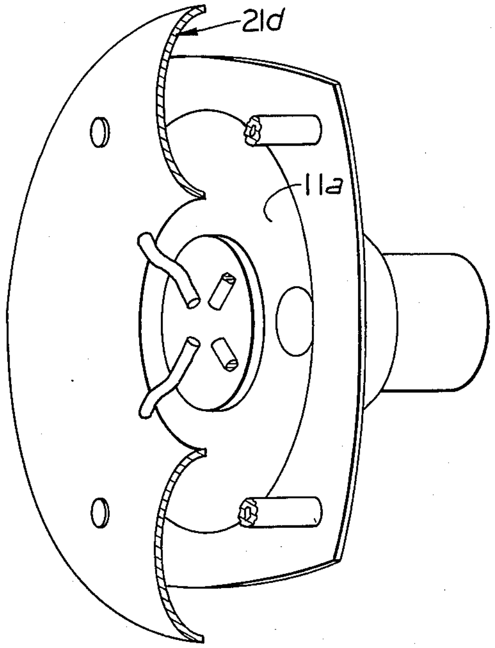

LOUDSPEAKER SYSTEM

BACKGROUND OF THE INVENTION

This invention relates to a loudspeaker system and more particularly to such a system which shall reproduce sound with a high degree of faithfulness and with a minimum of distortion and is a continuation-in-part of my co-pending application Ser. No. 857,651, filed Dec. 5, 1977, now abandoned.

Heretofore, dynamic loudspeakers of the cone type, capable of reproducing sound with ample volume and with acceptable distortion, in most cases, have the speaker cone or diaphragm facing the listeners. These cone type loudspeakers may be classified into woofers which reproduce the lowest tones, mid-range speakers which reproduce the middle tones and tweeters which reproduce the highest tones. The cone diaphragms of all three types suffer structural distortion when heavy forces are exerted on them by the voice coils. Structural distortion is greatest around the voice coil and is at an objectionable level for about 15 percent of the radial distance from the outer edge of the voice coil to the outer edge of the cone diaphragm, which terminates at the inner edge of the flexible edge or hinge, if one is used. While this distortion is slight, when measured against the entire output of the speaker system, much of it is of a shrill character and occurs within the range of frequencies which the human ear hears the loudest. This distortion, which I shall hereinafter refer to as center cone distortion, has a hashy, raspy sound which intrudes particularly on the mid-range frequencies of the human voice and of such instruments as pianos, pipe organs and violins.

Heretofore, there have been many attempts to overcome this center cone distortion. In the case of the woofer, one means has been to provide an electrical crossover network which blanks out frequencies higher than 250 to 500 cps from the woofer and then to add a larger mid-range speaker capable of reproducing sound down to 250 to 500 cps. However, even with these measures, a noticeable ghost of center cone distortion will usually be present in the woofer and the larger, more expensive mid-range speaker will have center cone distortion of its own at the upper end of the band of frequencies which the human ear hears the loudest. Depending upon the specific design of the larger mid-range speaker, it would be expected to produce center cone distortion in the range of from 4,000 to 6,000 cps or possibly as low as 2,500 cps.

Efforts have also been made in some speaker systems to eliminate center cone distortion by adding dampening masses to the center area of the woofer cones. This addition of dampening mass to the woofer cone defeats the very basic principle of a low distortion woofer, which is to keep the inertia of the cone assembly as low as possible. Accordingly, such added mass will cause the woofer to distort greatly in the very low frequencies.

Many efforts to reduce distortion in cone-type mid-range and tweeter speakers have been tried with little in the way of positive results. While metal cones have been used by some, the same center cone distortion problem exists. The result of the combined effect of center cone distortion at all three levels is a high degree of listener fatigue and an artificial sound to the loudspeaker system.

Another problem with existing loudspeaker systems is poor distribution of the sound at the upper end of the frequency range covered by the woofer since higher frequencies radiate in a more linear manner and must be reflected to make them turn corners. This effect becomes a factor of importance above about 250 cps. Heretofore, many loudspeaker systems have employed woofers designed to cut off at from 1,000 to 1,500 cps. The linear nature of the frequencies which such woofers emit between 250 and 1,500 cps, causes such frequencies to form a narrow band along the axis of the speaker. These frequencies are thus poorly distributed while the frequencies below 250 cps are well distributed because of their non-linear nature. As the frequencies increase, the problem becomes progressively more severe in the mid-range and tweeter speakers.

A still further problem encountered with conventional loudspeaker systems relates to the shape of the response curve of the woofers. Ideally, the highest volume of reproduction should occur at the lowest audible frequencies. But in practice most good woofers, because of the strain in the center of the cones, have a peak or "knee" on the response curve with the highest volume of sound occurring at about 1,000 cps. This knee or peak, which is usually near the cross-over point between the woofer and the mid-range speaker, causes a shrillness which is almost impossible to defeat with the aforementioned electrical cross-over network. Since the loudest sound which the human ear hears ranges between about 2,000 and 5,000 cps, it is preferable to have the woofer cut off at no more than about 1,000 cps so that the mid-range speaker can take over at above 1,000 cps and with its very small, low inertia cone, reproduce the loudest frequencies the ear hears with the lowest possible distortion.

Another attempt to solve the problem of center cone distortion has been to strengthen the cone sufficiently to eliminate such distortion, such as by providing a sandwich-like cone having inner and outer metal members with a non-metallic layer therebetween. The Hitachi metal cone loudspeaker shown in the October 1977 issue of Stereo Review Magazine, page 12, is such a speaker. The Tannoy speaker shown in the June 1977 issue of Stereo Review, page 107, shows a speaker cone in which ribbing is employed to prevent cone break-up or distortion under stress. Another attempt to prevent center cone distortion has been to use high strength carbon filaments in the cone paper.

There are at least three factors tending to cause the radial stresses in a loudspeaker cone to increase as we progress from the outer edge of the cone toward the voice coil at the center of the cone. These factors are:

(1) The area of a cone increases as the second power of the slant height of the cone. Accordingly, the resistance of the air to the movement of the cone would increase as the second power of the slant height of the cone.

(2) Since the outer portions of the cone cause compression or tension forces along the slant height, depending on which half of the sound wave is being induced at the time, such that the inner portions of the cone must bear not only the force caused by its pushing of the air but must also bear the forces from these outer portions as well, another first power must be added.

(3) Since the cross section of the paper cone through which this force must be transmitted to the voice coil diminishes to the first power of the reduction in slant height, the unit stress will increase as the first power as we progress along the slant height of the cone toward the voice coil.

From the above it can be seen that the unit stress along the slant height of the woofer cone increases at least as the fourth power as we progress from the outside of the cone toward the voice coil. The combined total of the tensile or compressive forces in a paper cone about 0.010 inch thickness may exceed one pound near the center of the cone. This can induce a radial unit stress of as much as 20 pounds per square inch near the voice coil. While this may seem like a very low unit stress, it is enough to compress the inner one inch of slope distance by about 0.00025 inch. But because of the fourth power function causing the stresses to lessen drastically with each inch we move away from the voice coil, we would compress the portion of the cone one inch farther out from the voice coil by only 0.000,015,6 inch under the same conditions. From this it can be seen that the inner 3.5 inches of a typical woofer cone would distort radially by about 16 times as much as the portion of paper cone between diameters of 3.5 inches and 5.5 inches.

It will be understood that the distortion with which we are concerned can be produced in sufficient quantity to offend the human ear by compression or tension forces so minute as to be difficult to measure.

The Wolff U.S. Pat. No. 1,786,279 and the Leon U.S. Pat. No. 2,643,727 both show reflectors for speaker systems. However, both patents show the reflectors as extending all the way across the center portion of the speaker whereby the reflectors reflect substantially all of the sound output of the speaker. Accordingly, with such reflectors, there could be no discrimination of sounds emitted from the speaker. While the Thuras U.S. Pat. No. 2,037,185 and the Buchmann U.S. Pat. No. 2,714,047 both disclose a loudspeaker system having a damper-like member mounted adjacent the center of the speaker cone, these patents do not teach the use of such a damper member in combination with a reflector member mounted in position to reflect only sound from the outer portion of a speaker cone aimed at least 90° away from the listeners with the innermost edge of the reflector being located at least 15 percent of the radial distance measured outwardly from the outer edge of the loudspeaker voice coil to the outer edge of the cone diaphragm.

SUMMARY OF THE INVENTION

In accordance with my invention I overcome the aforementioned difficulties and provide superior quality and distribution of the sound by mounting the speakers whereby they are turned at least 90° away from the listeners so that direct projection of the center cone distorted sound toward the listeners is minimized. At least one reflector is mounted in position to reflect only the undistorted sound from an outer portion of the speaker cone toward the listeners and to distribute this sound over a broad area toward the listeners. The sound being reflected by the reflector is directed outwardly of an enclosure defining a sound chamber for the loudspeaker system at least 90° from a line extending forwardly along the axis of the loudspeaker cone. The innermost edge of the reflector is located at least 15 percent of the radial distance as measured from the outer edge of the loudspeaker voice coil to the outer edge of the cone diaphragm. A damper pad is provided adjacent and along the axis of the speaker cone in position to intercept the center cone distortion and damp it out. The proper arrangement of these elements results in a loudspeaker system which produces sound of very low distortion, well distributed at all frequencies and with a nearly ideal response curve and with the utmost in economy and simplicity.

DESCRIPTION OF THE DRAWINGS

Loudspeaker systems embodying features of my invention are shown in the accompanying drawings, forming a part of this application, in which:

FIGS. 2, 3 and 4 show three modified forms of reflectors which may be employed;

FIG. 6 is a sectional view showing a loudspeaker system having two reflectors applied to a single speaker for better distribution of the mid-range frequencies;

FIG. 9 is a sectional view showing a loudspeaker system having a reflector in the general shape of a torus;

FIG. 10 is a perspective, partly broken away, view of the loudspeaker system shown in FIG. 9.

Figure 1:
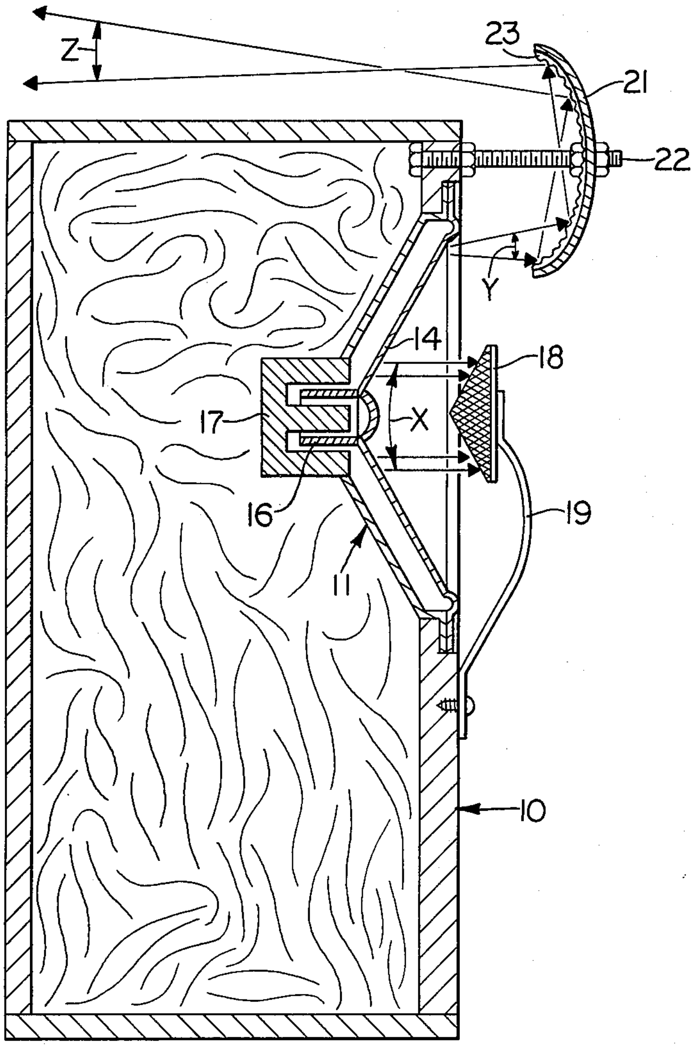
FIG. 1 is a sectional view showing my loudspeaker system with the speaker facing away from the listeners and the reflector and damper pad in operating position.

Referring now in detail to the drawings for a better understanding of my invention, I show in FIG. 1 an enclosure 10, formed of wood or other suitable material. Mounted within the enclosure 10 is a low frequency speaker or woofer 11. It will be understood that my improved system is also adapted for use with a medium frequency or mid-range speaker and a high frequency speaker or tweeter as indicated at 12 in FIG. 8.

The woofer 11 is provided with a paper cone 14 which is moved by a current of electricity which is induced in a voice coil 16 acting against the magnetic field in a magnet 17. The voice coil 16 produces a remarkably heavy force on the relatively weak paper cone and at the same time the cone 14 must be light in weight and therefore thin in order for it to have a minimum of inertia.

Since the force on the cone 14 is great and its strength is low, the cone 14 will distort or strain slightly under the stress induced by the voice coil 16. This distortion of the center portion of the cone 14 causes the center portion of the cone to radiate distorted sound in the area indicated at "X" in FIG. 1. A damper pad 18 is supported by a bracket 19 in position to absorb most of the center cone distortion. What little of this distorted sound radiated past the pad will be expended for the most part since it is quite linear in nature and it is projected away from the listeners.

Mounted forwardly of and adjacent the outer portion of the speaker cone 14 is a reflector 21 which is supported in place by a stud 22. The reflector is so disposed and shaped that it will reflect only sound from the outer, undistorted portion of the woofer cone 14 as indicated at "Y". The reflector 21, for ideal results, should have a textured surface 13 of fabric, thin fabric or other textured material to reduce the reflection of the sound at the upper end of the response curve of the woofer by just the right amount to produce an ideal response curve. By using a properly shaped reflector, preferably a modified parabolic reflector, the upper and more linear sound frequencies from the woofer 11 can be dispersed into a broad band as indicated at "Z". For the mid-range speaker the reflector will normally reach farther in toward the voice coil. Accordingly, the reflector surfaces may or may not need texture depending on the cross-over frequency to be achieved and the type of driver employed. Since tweeters reproduce the upper end of the response curve and the upper end is open-ended no texture will normally be required. That is, tweeters will most often have a nontextured surface so as to allow maximum emission of high frequencies.

While a modified parabolic reflector, such as is shown at 21 in FIG. 1 is ideal, it will be understood that satisfactory results can be obtained with many other shapes of reflectors. For example FIG. 2 illustrates a "V" shaped reflector 21*a* with which good results can be obtained.

The reflector can also take the form of two separate surfaces adapted to cooperate with each other to serve as a concave reflector. One such compound reflector is illustrated in FIG. 3 in which a support bracket 20 supports two flat reflectors 21*b* in such a manner that they act as a concave reflector. Yet another form of compound reflector is shown in FIG. 4 in which a bracket 24 supports two curved reflectors 21*c* in position for the reflectors to cooperate with each other to give the effect of a concave reflector.

Figure 5:
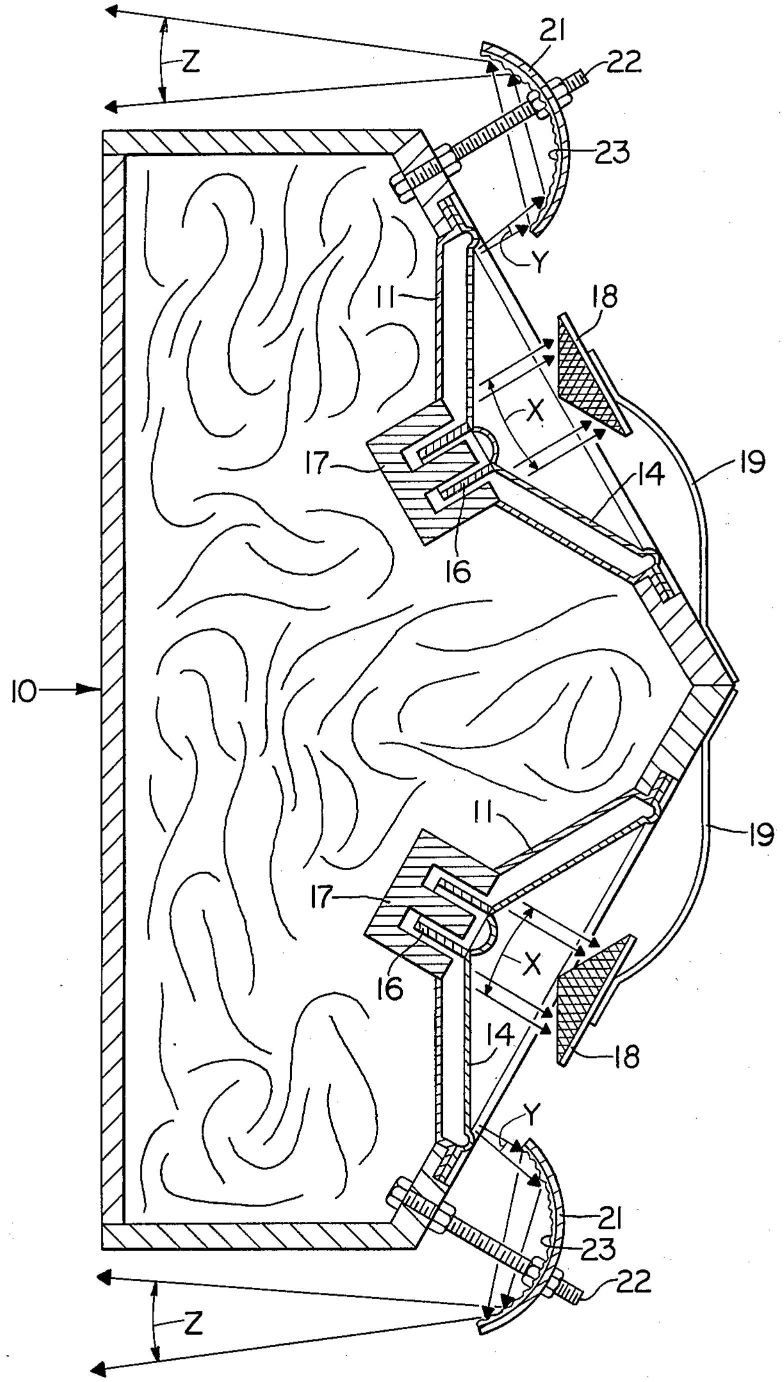
FIG. 5 is a sectional view showing a loudspeaker system having two speakers with the reflectors and damper pads in operating position.

In certain applications, it may be desirable to use more than one woofer 11. The advantages of my invention apply equally well to a speaker system with more than one woofer 11 as illustrated in FIG. 5. The use of two reflectors 21 in the embodiment shown in FIG. 5 gives excellent distribution of the frequencies at the upper end of the response curve of the woofer.

It is not necessary to have more than one woofer to obtain the advantages of the excellent lower mid-range distribution provided by the use of more than one reflector 21. FIG. 6 illustrates how one reflector 21 can be applied on either side of the woofer 11. In FIG. 6 a bracket 26 bridges between the reflectors 21 in order to support the damper pad 18 in the proper position.

In FIGS. 9 and 10 I show a reflector 21*d* in the general shape of a torus which surrounds the entire outer portion of a speaker cone 11*a*. Where the reflector covers a small segment of the outer portion of the cone diaphragms, as shown in FIGS. 1 through 6, more ambience is produced. That is, the sound produced is similar to that produced in a concert hall. On the other hand where there is more coverage of the diaphragm, as shown in FIGS. 9 and 10, less ambience is obtained but a better performance is obtained in public address speaker systems in large live halls. In a larger room which is fairly live, the sound should ideally come from one source and be projected in only one general direction as is the case with the reflector shown in FIGS. 9 and 10.

Figure 8:
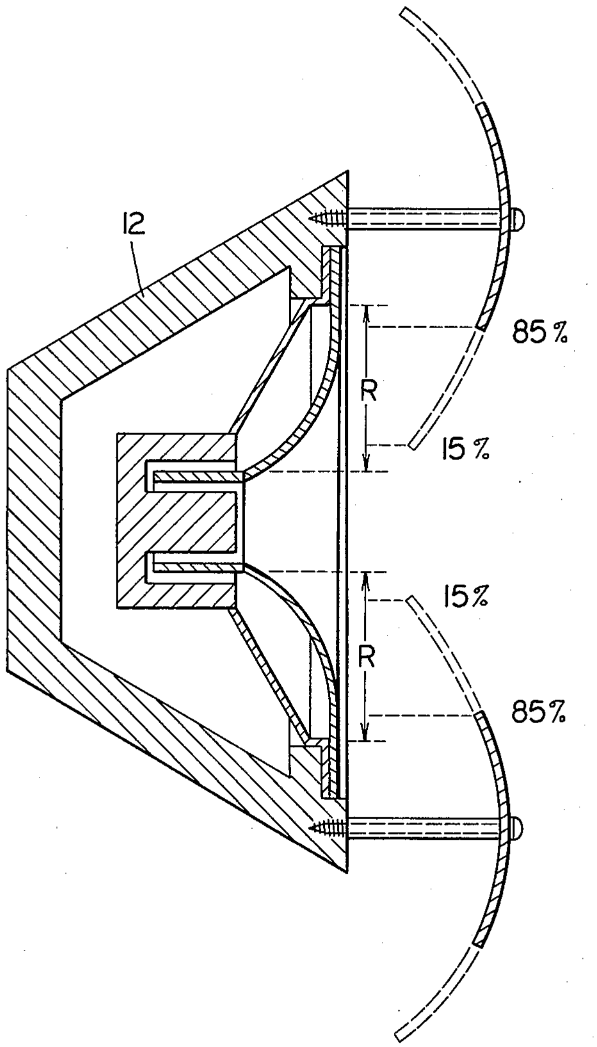
FIG. 8 is a sectional view showing a loudspeaker system having two reflectors applied to a single speaker with the innermost edge of each reflector being shown in dotted lines as located at approximately 15% of the radial distance as measured away from a line extending forwardly from the outer edge of the loudspeaker voice coil to the outer edge of the cone diaphragm and shown in solid lines as being located approximately 85% of such radial distance.

As set forth on page 34, FIG. 1.138, of "Audio Cyclopedia," second edition, published in 1978, about 1.8 percent distortion is the maximum amount of harmonic distortion (music) which a human ear can tolerate before the reproduction becomes objectionable. In actual practice, I find that this point is reached when the innermost edge of my reflector is located approximately 15 percent of the radial distance from the outer edge of the loudspeaker voice coil to the outer edge of the cone diaphragm. In FIG. 8, the radial distance from the outer edge of the vooice coil to the outer edge of the cone diaphragm is indicated at "R".

Figure 11:
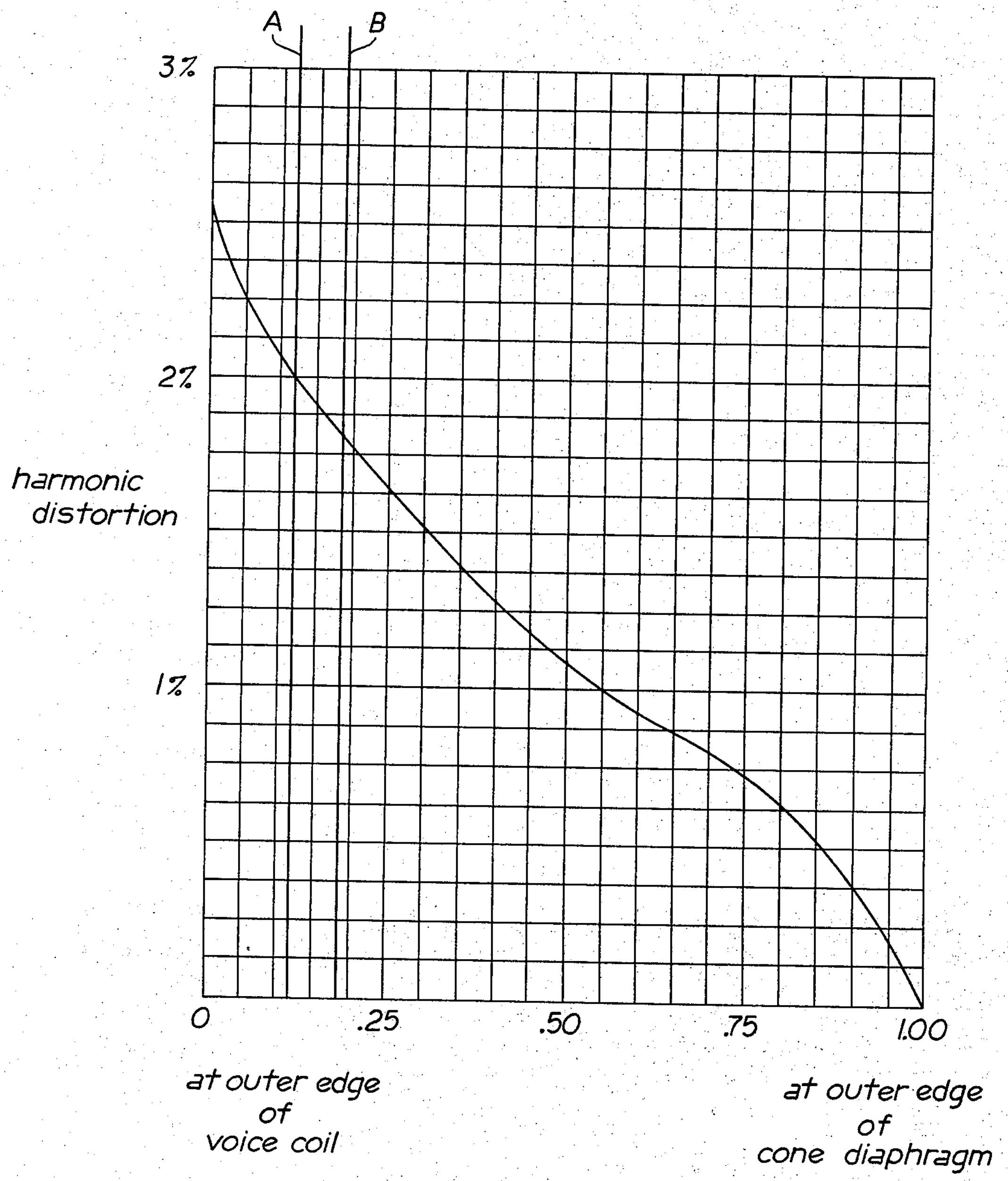
FIG. 11 is a graph showing the approximate amounts of harmonic distortion which are objectionable and tolerable, to the human ear as related to locations along the radial distance from the outer edge of the loudspeaker voice coil to the outer edge of the cone diaphragm when a 40 cps tone is being reproduced on a 10 inch acoustic suspension speaker at 3.66 electrical watts RMS (root mean square).

The graph shown in FIG. 11 shows the amounts of harmonic distortion which are objectionable and tolerable to the human ear as related to locations along the radial distance from the outer edge of the voice coil to the outer edge of the cone diaphragm.

I have found that sounds produced at the left of line "A" on the graph are objectionable while sounds produced at the right side of line "B" on the graph are tolerable.

In actual practice I have found that the maximum distance the inner edge of the reflector can be positioned outwardly away from the voice coil and good results be achieved is approximately 85 percent of the radial distance measured outwardly from the outer edge of the loudspeaker voice coil to the outer edge of the cone diaphragm.

I have found that the specific location at which the reflector or reflectors are mounted on my pilot speaker are determined to a great extent on the basis of tone balance and ambience as well as on distortion. Accordingly, the specific position of the reflector may vary with the inner edge of the reflector located from 15 percent to 85 percent of the radial distance measured outwardly from the outer edge of the loudspeaker voice coil to the outer edge of the cone diaphragm.

The smaller the cone, the lower its inertia will be. Also, its tendency to break up will be somewhat less and the frequency at which the smaller cone breaks up will be higher. Accordingly, the damper pad will not need to be quite so large in diameter and the reflector can be placed so as to reach a little farther inward toward the voice coil without getting too much distortion.

The larger the speaker and consequentially the lower the frequencies handled, the more this lower pitched sound will bend. Accordingly, a reflector cannot reach so far inward toward the voice coil on a woofer as for a mid-range or a tweeter since a tweeter handles more linear sound. Otherwise, the greater bending would cause an excessive amount of lower pitched distortion to be reflected.

Since loudness contour curves and cross-over considerations dictate how the roll-off or reduction in loudness must be handled at the upper end of the woofer response curve, the reflector will not normally reach as far inward toward the voice coil. This reduces the amount of the high frequencies reflected. The most ideal roll-off will also normally call for heavier texture on the surfaces of the reflectors of a woofer to further shape the upper end of the response curve.

Another important variable is that the deeper the cone, the farther the reflectors must reach in toward the voice coil. A cone tends to project its outpput of sound somewhat perpendicular to the surface of the diaphragm of the cone.

Also, the lower the frequencies to be reproduced, the farther the damper pad must be placed from the cone. This is necessary because the amplitude of the air movement is greater for low frequencies and the pad will physically interfere with the air movement on lower frequencies if any impedance is placed near enough to the diaphragm of the cone to throttle the movement of air. The combined impedance of the damper pads and reflectors must be carefully considered to prevent damping of the lower frequencies.

The sound chamber for the speaker system will vary according to frequencies being reproduced by a particular speaker. The woofer will have a large air space, the mid-range will have a much smaller air space and the tweeter may have either a very small air space in the speaker box with holes in the speaker frame for air movement in the frame or the frame of the tweeter may be solid so that the space between the frame and the cone is the sound chamber.

Figure 7:
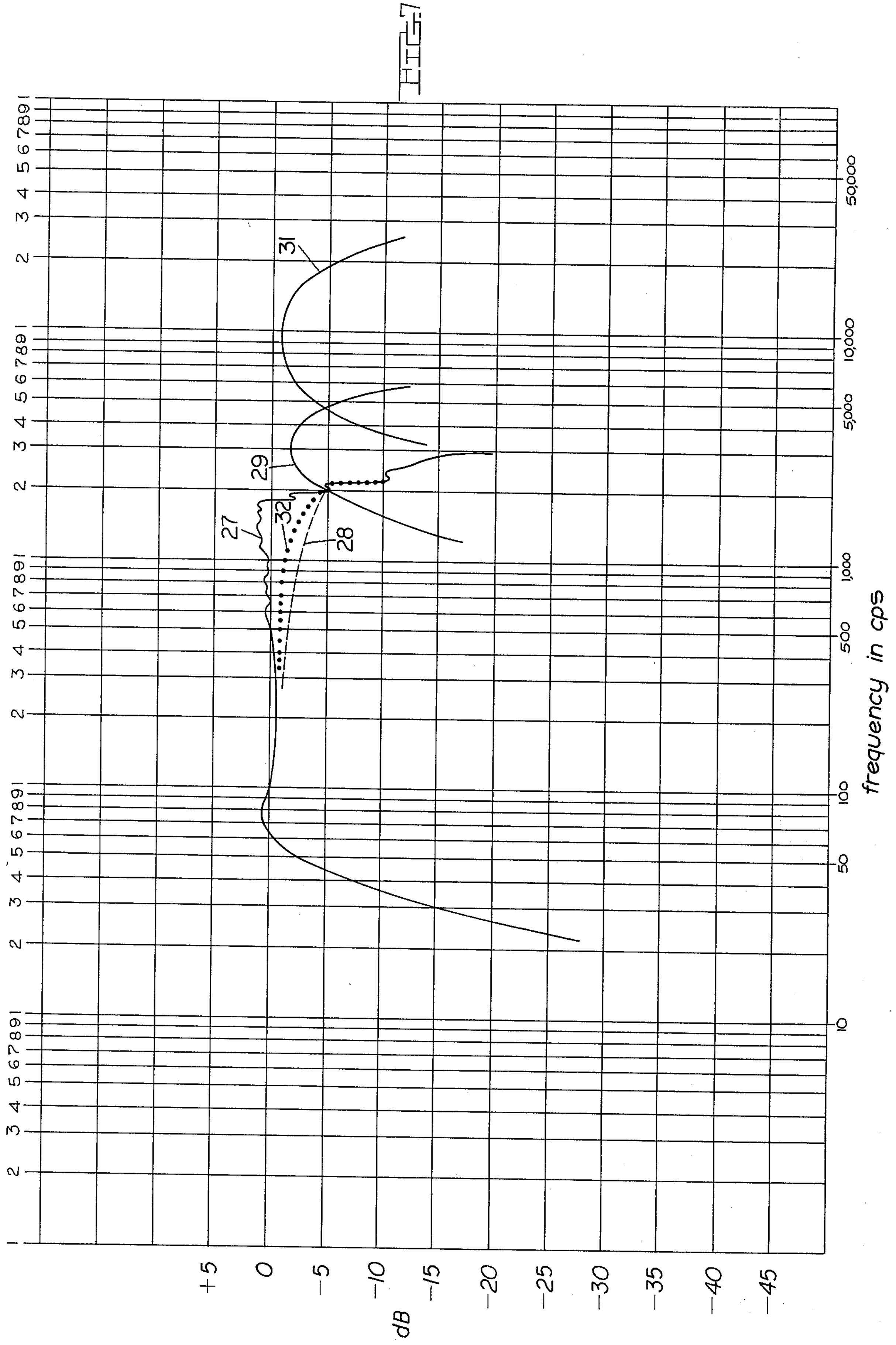
FIG. 7 is a graph showing the approximate response curve of a ten inch acoustic suspension woofer aimed toward the listeners, aimed away from the listeners and aimed away from the listeners with my improved reflector associated therewith.

Referring now to the graph shown in FIG. 7 of the drawings, the approximate response curve of a ten inch acoustic suspension speaker aimed toward the listeners is shown in solid lines at 27 and the approximate response curve of such a speaker turned away from the listeners is shown in dash lines 28. Due to center cone distortion in must prior art woofers, the highest volume of reproduction does not occur at the lowest audible frequencies but has a peak or sharp knee in the response curve with the highest volume of sound occurring at from 1,000 to 2,000 cps, as shown by the solid line 27. This peak or knee in the response curve of the woofer usually occurs near the cross-over point between the response curve 27 of the woofer and the response curve 29 of the mid-range speaker and causes a shrillness which is almost impossible to eliminate with an electrical cross-over network. The response curve of the high frequency speaker or tweeter is indicated at 31. The smooth rounded response curve produced in accordance with my invention is indicated by the dotted line 32.

From the foregoing it will be seen that I have devised an improved loudspeaker system which reproduces sound with a minimum of distortion and maintains the mass of the speaker cone sufficiently low to prevent the introduction of an objectionable amount of distortion. Also, my improved loudspeaker system is simple of construction, economical of manufacture and may be assembled with a minimum of time and effort.

While I have shown my invention in several forms, it will be obvious to those skilled in the art that it is not so limited, but is susceptible of various other changes and modifications without departing from the spirit thereof.

What I claim is:

1. A loudspeaker system comprising:
   (a) an enclosure defining a sound chamber having a front wall with a sound emitting opening therein,
   (b) an outwardly and forwardly flaring loudspeaker cone mounted within said enclosure adjacent said sound emitting opening with the innermost portion of said loudspeaker cone emitting the most distorted sound and the outermost portion emitting the least distorted sound, and
   (c) at least one reflector mounted outwardly of said enclosure and forwardly of an outer portion of the loudspeaker cone with the outermost edge of said reflector being located outwardly of and beyond the outer edge of the cone diaphragm and outwardly of and beyond said enclosure as measured outwardly in a radial direction from a line extending forwardly along the axis of said loudspeaker cone with the innermost edge of said reflector being located at least 15 percent of the radial distance measured outwardly from the outer edge of the loudspeaker voice coil to the outer edge of the cone diaphragm and with the sound being reflected by said reflector being directed outwardly of said enclosure at least 90° from a line extending forwardly along the axis of the loudspeaker cone.

2. A loudspeaker system as defined in claim 1 in which said innermost edge of said reflector is located at from 15 percent to 85 percent of the radial distance measured outwardly from the outer edge of the loudspeaker voice coil to the outer edge of the cone diaphragm.

3. A loudspeaker system as defined in claim 1 in which said reflector has a textured surface to roll-off the higher frequencies emitted from said outer portion of said speaker cone.

4. A loudspeaker system as defined in claim 1 in which a dampening member is mounted forwardly of said central portion of said loudspeaker cone to dampen sound emitted from said central portion of said speaker cone.

5. A loudspeaker system as defined in claim 1 in which a plurality of reflectors are mounted at angularly spaced locations forwardly of said outer portion of said speaker cone.

6. A loudspeaker system as defined in claim 1 in which said reflector is generally concave in shape as viewed in cross section.

7. A loudspeaker system as defined in claim 1 in which said reflector is generally parabolic in shape as viewed in cross section.

8. A loudspeaker system as defined in claim 1 in which said reflector is of a generally torus shape.

* * * * *